(12) United States Patent
Lee et al.

(10) Patent No.: US 12,308,067 B2
(45) Date of Patent: May 20, 2025

(54) MEMORY DEVICE HAVING STABLE SELF-REFRESH OPERATION AND OPERATING METHOD THEREOF

(71) Applicant: SK hynix Inc., Gyeonggi-do (KR)

(72) Inventors: Sang Hoon Lee, Gyeonggi-do (KR); Sang Jin Byeon, Gyeonggi-do (KR); Kyo Yun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 212 days.

(21) Appl. No.: 18/107,503

(22) Filed: Feb. 9, 2023

(65) Prior Publication Data

US 2024/0079043 A1    Mar. 7, 2024

(30) Foreign Application Priority Data

Sep. 2, 2022 (KR) .................. 10-2022-0111372

(51) Int. Cl.
*G11C 11/406* (2006.01)
(52) U.S. Cl.
CPC .. *G11C 11/40615* (2013.01); *G11C 11/40626* (2013.01)
(58) Field of Classification Search
None
See application file for complete search history.

(56) References Cited

U.S. PATENT DOCUMENTS

| 7,876,636 | B2 * | 1/2011 | Jeong | G11C 11/40626 |
| | | | | 365/189.08 |
| 2002/0017939 | A1 * | 2/2002 | Okuda | G11C 7/1051 |
| | | | | 327/296 |
| 2017/0352405 | A1 * | 12/2017 | Choi | G11C 11/4093 |
| 2022/0130452 | A1 * | 4/2022 | Kim | G11C 11/40615 |

FOREIGN PATENT DOCUMENTS

KR    10-2017-0130685 A    11/2017

* cited by examiner

*Primary Examiner* — J. H. Hur
(74) *Attorney, Agent, or Firm* — IP & T GROUP LLP

(57) ABSTRACT

An operating method of a memory device, comprising: entering self-refresh section, updating a counting code by counting an edge of a reference cycle signal, first activating an operation control signal for the self-refresh section when a temperature application code has an initialized value in response to the counting code, updating the temperature application code after the operation control signal is first activated, second activating the operation control signal in response to the counting code based on the updated temperature application code, exiting from the self-refresh section, and initializing the counting code and the temperature application code.

18 Claims, 10 Drawing Sheets

MEMORY DEVICE HAVING STABLE SELF-REFRESH OPERATION AND OPERATING METHOD THEREOF

CROSS-REFERENCE TO RELATED APPLICATION

This application claims priority under 35 U.S.C. § 119 to Korean Patent Application No. 10-2022-0111372 filed on Sep. 2, 2022, which is incorporated herein by reference in its entirety.

BACKGROUND

1. Field

Various embodiments of the present disclosure relate to a semiconductor design technology and, more particularly, to a memory device having a self-fresh operation and an operating method thereof.

2. Discussion of the Related Art

In a volatile memory device such as dynamic random access memory (DRAM), among memory devices, data that has been stored in a memory cell becomes volatile over time unlike nonvolatile memory such as flash memory. The volatile memory device needs to perform a refresh operation of writing information that has been stored in a memory cell again every given cycle in order to prevent such a phenomenon.

The refresh operation may include an auto-refresh mode in which memory cells are refreshed in response to a refresh command that is periodically applied and a self-refresh mode in which memory cells are refreshed by using a built-in timer in response to a self-refresh entry and exit command.

A retention time of data that has been stored in a memory cell is also very sensitive to temperature changes. Accordingly, it is necessary to adjust an operating condition for refresh control circuits that are included in a memory device based on a change in the internal temperature of the memory device. In order to adjust the operating condition according to a change in the internal temperature of the memory device, the memory device may include a temperature sensor, such as a digital temperature sensor regulator (DTSR), an analog temp sensor regulator (ASTR), or temperature compensated self refresh (TCSR). The temperature sensor may generate a temperature code.

SUMMARY

According to an embodiment of the present disclosure, a memory device may include: a counting circuit configured to generate a counting code by counting a first edge of a reference cycle signal having a given frequency in a self-refresh section; a temperature code output circuit configured to: receive a temperature detection code that is synchronized with a second edge of the reference cycle signal, output the temperature detection code as a temperature application code in response to a toggling of the operation control signal in the self-refresh section, and output the temperature application code that is initialized out of the self-refresh section; a signal generation circuit configured to: compare the counting code and the temperature application code in the self-refresh section and generate the operation control signal the toggling of which is controlled based on a result of the comparison; and a refresh operation circuit configured to perform a refresh operation on a cell array area in response to the toggling of the operation control signal in the self-refresh section.

According to an embodiment of the present disclosure, an operating method of a memory device, may include: entering self-refresh section; updating a counting code by counting an edge of a reference cycle signal; first activating an operation control signal for the self-refresh section when a temperature application code has an initialized value in response to the counting code; updating the temperature application code after the operation control signal is first activated; second activating the operation control signal in response to the counting code based on the updated temperature application code; exiting from the self-refresh section; and initializing the counting code and the temperature application code.

According to an embodiment of the present disclosure, a memory device may include: a counting circuit configured to increase a value of a counting code in response to a first edge of a reference cycle signal having a given frequency in an activation interval of a self-refresh signal; a temperature code output circuit configured to: receive a temperature detection code that is synchronized with a second edge of the reference cycle signal after the self-refresh signal is activated, and output the temperature detection code as a temperature application code in response to an operation control signal being toggled after the self-refresh signal is activated; a signal generation circuit configured to toggle the operation control signal in response to the counting code in the activation interval of the self-refresh signal after the first edge of at least one reference cycle signal elapses after the self-refresh signal is activated; and a refresh operation circuit configured to perform a refresh operation on a cell array area in response to the toggling of the operation control signal in the activation interval of the self-refresh signal.

According to an embodiment of the present disclosure, a memory device may include: an operation circuit configured to perform a refresh operation on a memory cell array whenever a first signal toggles; a reset control circuit configured to generate a second signal, which is enabled and disabled respectively when the first signal is enabled and disabled; a counting circuit configured to count a clock to generate a count code while the second signal is disabled and configured to keep the count code initialized while the second signal is enabled; a temperature circuit configured to generate a temperature code whenever the first signal becomes disabled; and a control circuit configured to enable the first signal when the count code is identical to the temperature code and configured to disable the first signal otherwise.

According to an embodiment of the present disclosure, a memory device may include: an operation circuit configured to perform a refresh operation on a memory cell array whenever a control signal toggles; a counting circuit configured to count a clock to generate a count code while the control signal is disabled and configured to keep the count code initialized while the control signal is enabled; a temperature circuit configured to generate a temperature code whenever the control signal becomes disabled; and a control circuit configured to enable the control signal when the count code is equal to the temperature code and configured to disable the control signal otherwise.

DETAILED DESCRIPTION

Figure 1:
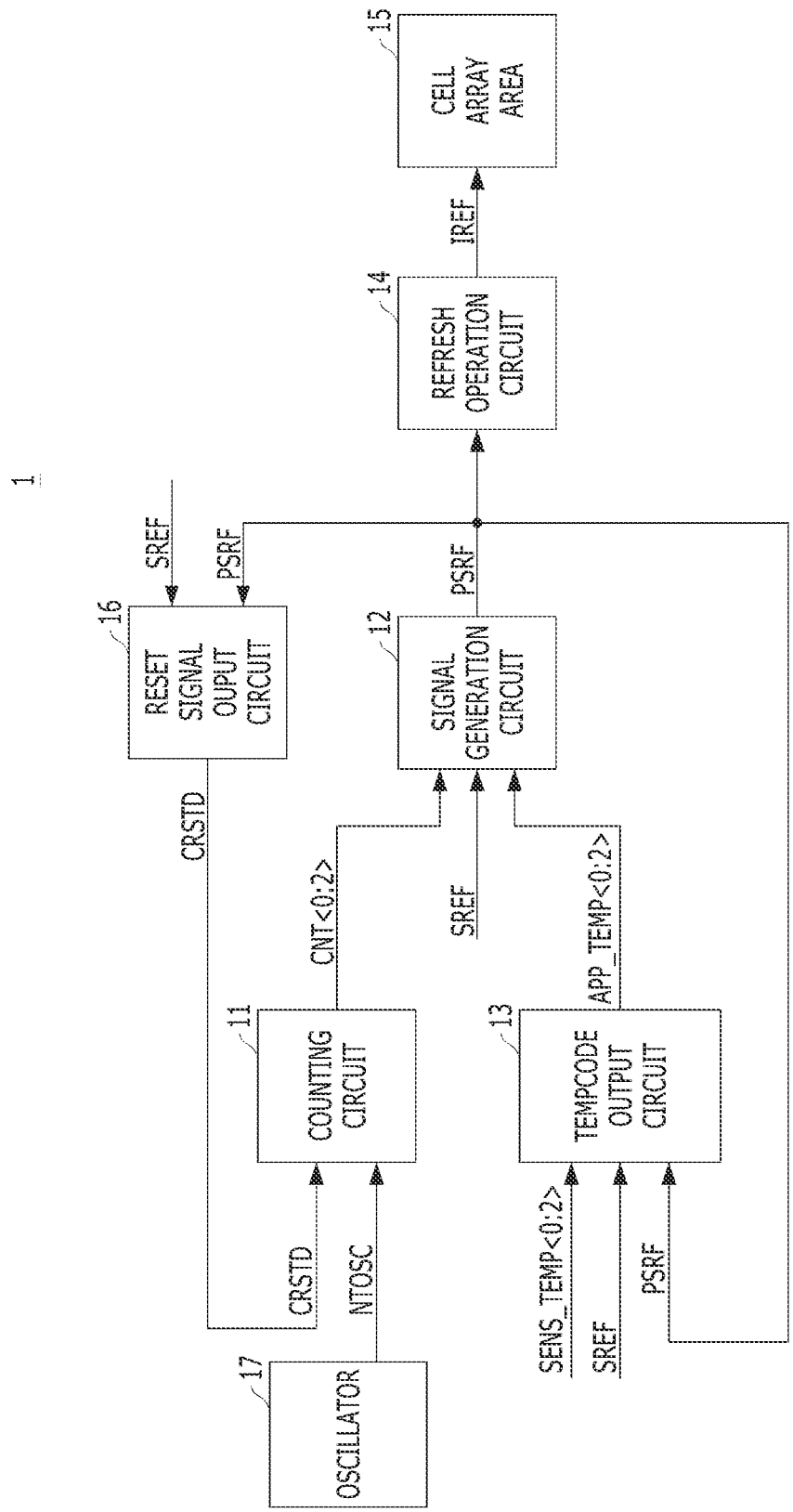
FIG. 1 is a diagram for describing a construction of a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments of the present disclosure provide a memory device capable of performing stable self-refresh by controlling a self-refresh entry operation and an operation of updating a temperature code corresponding to an internal temperature so that the self-refresh entry operation and the operation of updating a temperature code do not influence each other, and an operating method thereof.

Technical objects to be achieved by the present disclosure are not limited to the aforementioned object, and the other objects not described above may be evidently understood from the following description by a person having ordinary knowledge in the art to which the present disclosure pertains.

According to this technology, an operation of applying a temperature code to a refresh cycle change may have a margin regardless of self-refresh entry timing.

Accordingly, a self-refresh entry operation and an operation of applying a temperature code to a refresh cycle change can be controlled so that the self-refresh entry operation and the operation of applying a temperature code do not influence each other.

As a result, a memory device having a stable self-refresh operation can be provided.

FIG. 1 is a diagram for describing a construction of a memory device according to an embodiment of the present disclosure.

Referring to FIG. 1, the memory device 1 according to an embodiment of the present disclosure may include a counting circuit 11, a signal generation circuit 12, a temperature code (TEMCODE) output circuit 13, a refresh operation circuit 14, a cell array area 15, a reset signal output circuit 16, and an oscillator 17.

The oscillator 17 may generate a reference cycle signal NTOSC having a set frequency. In an embodiment, the oscillator 17 may be implemented by using a ring oscillator. The frequency of the reference cycle signal NTOSC may be set based on the type or operating method of a memory device. For example, the reference cycle signal NTOSC may have a frequency of 8 MHz that toggles every 500 ns.

The memory device 1 may perform a self-refresh operation based on a self-refresh signal SREF that is input to the signal generation circuit 12 while the reference cycle signal NTOSC toggles. While the self-refresh signal SREF is activated, the memory device 1 may be in a self-refresh section. While the self-refresh signal SREF is deactivated, the memory device 1 may be out of the self-refresh section.

The counting circuit 11 may generate counting codes CNT<0:2> by counting a falling edge of the reference cycle signal NTOSC in the self-refresh section. The counting circuit 11 may generate the counting codes CNT<0:2> in response to a falling edge of the reference cycle signal NTOSC while the state of a counting reset signal CRSTD is in a deactivation state, the counting reset signal CRSTD being deactivated when the self-refresh signal SREF is activated.

Values of the counting codes CNT<0:2> that are generated by the counting circuit 11 may be varied depending on a set frequency of the reference cycle signal NTOSC. That is, the counting circuit 11 may change values of the counting codes CNT<0:2> every falling edge of the reference cycle signal NTOSC. For example, when the reference cycle signal NTOSC has a frequency of 8 MHz, a falling edge of the reference cycle signal NTOSC may be repeated every 500 ns. Accordingly, values of the counting codes CNT<0: 2> may be increased every 500 ns.

The counting circuit 11 may output values of the counting codes CNT<0:2> that are initialized when the counting reset signal CRSTD becomes activated. The counting reset signal CRSTD may become activated in two cases. First, the counting reset signal CRSTD may become activated out of the self-refresh section. That is, the counting reset signal CRSTD may be activated while the self-refresh signal SREF is deactivated. Second, the counting reset signal CRSTD may become activated and deactivated respectively when an operation control signal PSRF becomes activated and deactivated even in the self-refresh section, as discussed later. The counting circuit 11 may initialize the counting codes CNT<0:2> when the counting reset signal CRSTD becomes activated, i.e., when the self-refresh signal SREF becomes deactivated (i.e., out of the self-refresh section) or when the operation control signal PSRF becomes activated in the self-refresh section. The counting circuit 11 may output the initialized value of the counting codes CNT<0:2> out of the self-refresh section or when the operation control signal PSRF becomes activated in the self-refresh section.

The counting circuit 11 may output values of the counting codes CNT<0:2> that are initialized when the counting reset signal CRSTD toggles, in the self-refresh section, from the deactivated state to the activated state. That is, the counting circuit 11 may output values of the counting codes CNT<0: 2> that are initialized in response to the counting reset signal CRSTD the state of which toggles to an activation state in the interval in which the state of the self-refresh signal SREF is the activation state.

When the counting circuit 11 increases values of the counting codes CNT<0:2>, initialized values of the counting codes CNT<0:2> may mean that the logic levels of all bits that are included in a code value become logic low levels. In contrast, when the counting circuit 11 decreases values of the counting codes CNT<0:2>, initialized values of the counting codes CNT<0:2> may mean that the logic levels of all bits that are included in a code value become logic high levels.

The reset signal output circuit 16 may toggle the counting reset signal CRSTD in response to at least one of the operation control signal PSRF and the self-refresh signal SREF. The reset signal output circuit 16 may activate the counting reset signal CRSTD in response to the operation control signal PSRF when the self-refresh signal SREF is activated, i.e., in the self-refresh section.

The reset signal output circuit 16 may activate the counting reset signal CRSTD out of the self-refresh section, i.e., when the self-refresh signal SREF is deactivated.

According to an embodiment, although not illustrated, a temperature detection circuit for generating temperature detection codes SENS_TEMP<0:2> may be further included in the memory device 1. The temperature detection circuit may measure an operating temperature of the memory device 1. Since the operating temperature of the memory device 1 may be irregularly changed, timing at which values of the temperature detection codes that are generated by the temperature detection circuit are changed may also be irregular.

However, the temperature detection circuit may output the generated temperature detection codes SENS_TEMP<0:2> at a rising edge of the reference cycle signal NTOSC. Accordingly, the temperature detection codes SENS_TEMP<0:2> may be applied to the temperature code output circuit 13 in the state in which the temperature detection codes SENS_TEMP<0:2> have been synchronized with the rising edge of the reference cycle signal NTOSC.

According to an embodiment, the temperature detection codes SENS_TEMP<0:2> may be generated from the outside of the memory device 1, and may be applied to the memory device 1. In this case, the memory device 1 may further include a temperature reception circuit for receiving the temperature detection codes SENS_TEMP<0:2> at the rising edge of the reference cycle signal NTOSC. However, this is merely an embodiment, and the present disclosure may not be limited to this embodiment.

The cycle in which an operation of detecting the operating temperature of the memory device 1 is repeated may be different from the toggling cycle of the reference cycle signal NTOSC. For example, whenever a rising edge of the reference cycle signal NTOSC is repeated twenty times, an operation of detecting the operating temperature may be performed once. That is, values of the temperature detection codes SENS_TEMP<0:2> may be changed whenever the reference cycle signal NTOSC toggles plural times.

The temperature code output circuit 13 may output the temperature detection codes SENS_TEMP<0:2> as temperature application codes APP_TEMP<0:2> whenever the operation control signal PSRF toggles in the self-refresh section, that is, in the interval in which the state of the self-refresh signal SREF is the activation state. Out of the self-refresh section, the temperature code output circuit 13 may output the temperature application codes APP_TEMP<0:2> that have been initialized. Out of the self-refresh section, the temperature code output circuit 13 may not change values of the temperature application codes APP_TEMP<0:2> that are initialized when exiting the self-refresh section. That is, the temperature code output circuit 13 may maintain, out of the self-refresh section, values of the temperature application codes APP_TEMP<0:2> that are initialized when the self-refresh signal SREF becomes deactivated.

The signal generation circuit 12 may compare the counting codes CNT<0:2> and the temperature application codes APP_TEMP<0:2> in the self-refresh section, and may control whether to toggle the operation control signal PSRF based on a result of the comparison. The signal generation circuit 12 may compare the counting codes CNT<0:2> and the temperature application codes APP_TEMP<0:2> on a bit-by-bit basis in the self-refresh section and may toggle the operation control signal PSRF when the counting codes CNT<0:2> are the same as the temperature application codes APP_TEMP<0:2>. The reset signal output circuit 16 may activate the counting reset signal CRSTD in response to the operation control signal PSRF being activated by the signal generation circuit 12. Values of the counting codes CNT<0:2> that are generated by the counting circuit 11 may be initialized in response to the counting reset signal CRSTD being activated. In response to the values of the counting codes CNT<0:2> being initialized, the counting codes CNT<0:2> and the temperature application codes APP_TEMP<0:2> may become different from each other. Accordingly, the signal generation circuit 12 may deactivate the operation control signal PSRF.

The time amount in which the signal generation circuit 12 keeps the operation control signal PSRF activated may be the time amount taken for operations of the reset signal output circuit 16, the counting circuit 11, and the signal generation circuit 12. Accordingly, delay circuits 24 and 25 (refer to FIG. 2) for securing a sufficient duration of the operation control signal PSRF may be included in the signal generation circuit 12.

As a result, the operation control signal PSRF that is generated by the signal generation circuit 12 may be a signal that is activated during the time amount taken for operations of the signal generation circuit 12, the reset signal output circuit 16, and the counting circuit 11, from timing at which values of the counting codes CNT<0:2> that are changed at a falling edge of the reference cycle signal NTOSC are input to the signal generation circuit 12.

The temperature code output circuit 13 may output the temperature detection codes SENS_TEMP<0:2> as the temperature application codes APP_TEMP<0:2> in response to the toggling of the operation control signal PSRF in a self-refresh section. Values of the temperature detection codes SENS_TEMP<0:2> may be changed at a rising edge of the reference cycle signal NTOSC. Values of the temperature application codes APP_TEMP<0:2> may be changed at timing at which the toggling of the operation control signal PSRF that is started by the signal generation circuit 12 based on a falling edge of the reference cycle signal NTOSC is completed. Accordingly, timing at which values of the temperature detection codes SENS_TEMP<0:2> are changed and timing at which values of the temperature application codes APP_TEMP<0:2> are changed may have a margin corresponding to an interval between the rising edge of the reference cycle signal NTOSC and timing that is later than the falling edge of the reference cycle signal NTOSC (i.e., the timing at which the toggling of the operation control signal PSRF is completed).

The refresh operation circuit 14 may perform a refresh operation on the cell array area 15 whenever the operation control signal PSRF toggles in the self-refresh section. The refresh operation may mean an operation of sequentially refreshing multiple banks that are included in the cell array area 15. That is, the refresh operation circuit 14 may generate an internal refresh signal IREF whenever the operation control signal PSRF toggles in the self-refresh section, and may output the internal refresh signal IREF to the cell array area 15. The cell array area 15 may include multiple banks within the cell array area 15, and may perform a refresh operation on each of the multiple banks in response to the internal refresh signal IREF.

Each of the counting codes CNT<0:2>, the temperature detection codes SENS_TEMP<0:2>, and the temperature application codes APP_TEMP<0:2> may include N bits. In this case, N may mean a natural number that is equal to or greater than 2. In the aforementioned description, the writing "<0:2>" has been used when N is 3. In the following description, N is 3.

Figure 2:
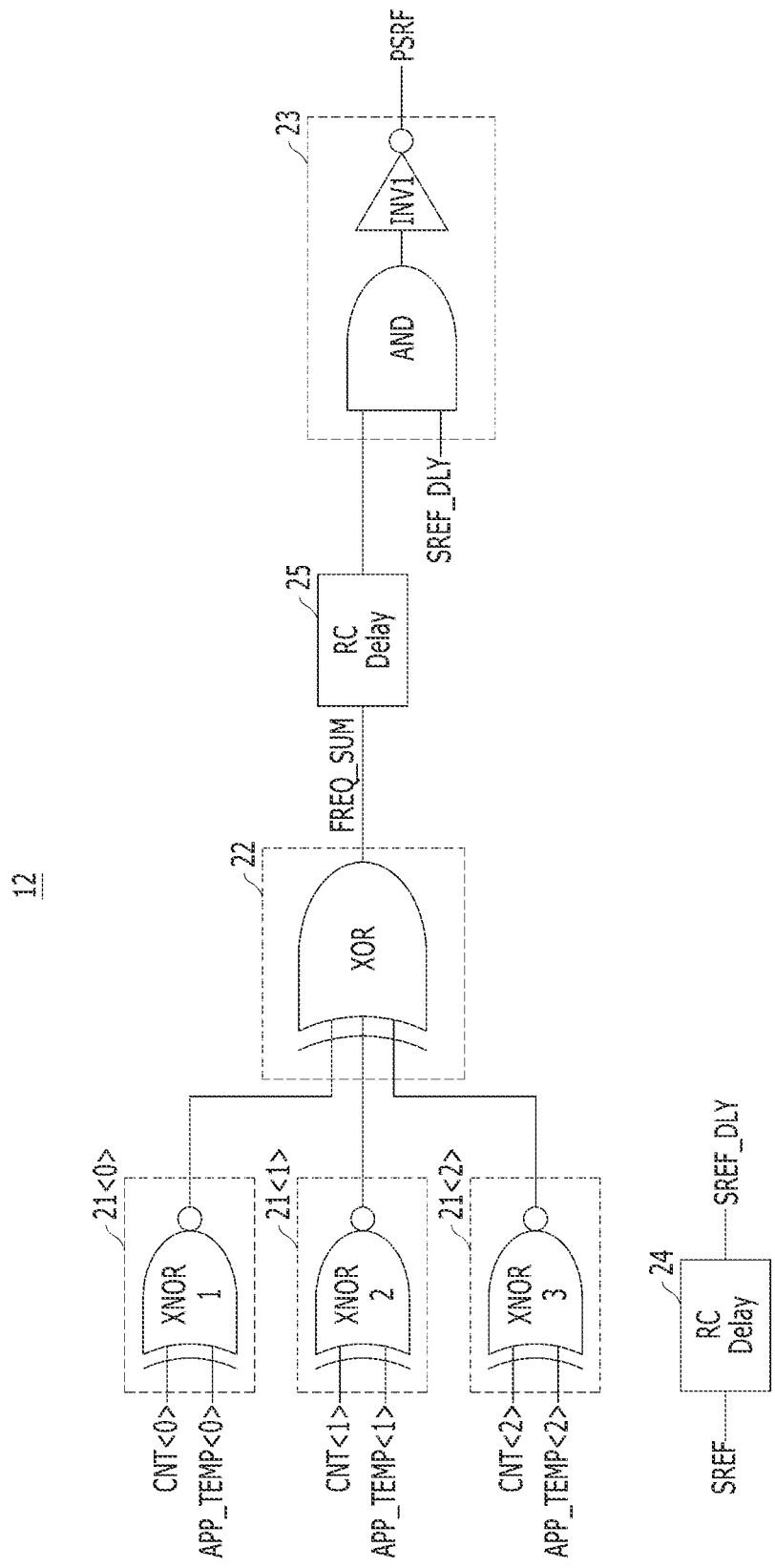
FIG. 2 is a diagram for describing a detailed construction of a signal generation circuit among the components of the memory device disclosed in FIG. 1, according to an embodiment of the present disclosure.

FIG. 2 is a diagram for describing a detailed construction of the signal generation circuit among the components disclosed in FIG. 1, of the memory device according to an embodiment of the present disclosure.

Referring to FIG. 2, the signal generation circuit 12 may include N comparison circuits 21<0:2>, a comparison and summation circuit 22, a first delay circuit (RC Delay) 25, a second delay circuit (RC Delay) 24, and a signal output circuit 23.

The N comparison circuits 21<0:2> may compare N bits that are included in the counting codes CNT<0:2> and N bits that are included in the temperature application codes APP_TEMP<0:2>, respectively. The N comparison circuits 21<0:2> may include respective XNOR gates XNOR1, XNOR2, and XNOR3 each for receiving one of the N bits that are included in the counting codes CNT<0:2> and one of the N bits that are included in the temperature application codes APP_TEMP<0:2> and performing an XNOR operation on the received two bits.

According to an embodiment, the first comparison circuit 21<0> of the three comparison circuits 21<0:2> may compare values of the first bit CNT<0> of the counting codes CNT<0:2> and the first bit APP_TEMP<0> of the temperature application codes APP_TEMP<0:2>. That is, the XNOR gate XNOR1 that is included in the first comparison circuit 21<0> may output a signal having a logic high level when values of the first bit CNT<0> of the counting codes CNT<0:2> and of the first bit APP_TEMP<0> of the temperature application codes APP_TEMP<0:2> are identical with each other, and may output a signal having a logic low level when values of the first bit CNT<0> of the counting codes CNT<0:2> and of the first bit APP_TEMP<0> of the temperature application codes APP_TEMP<0:2> are not identical with each other.

Likewise, the remaining comparison circuits 21<1> and 21<2> may operate similarly to the first comparison circuit 21<1>. For example, each of the remaining comparison circuits 21<1> and 21<2> may compare bit values of a corresponding counting code of the counting codes CNT<0:2> and a corresponding temperature application code of the temperature application codes APP_TEMP<0:2>. Each of the XNOR gates XNOR2 and XNOR3 that are included in the remaining comparison circuits 21<1> and 21<2> may output a signal having a logic high level when bit values that are compared are identical with each other, and may output a signal having a logic low level when the bit values that are compared are not identical with each other.

The comparison and summation circuit 22 may generate a comparison summation signal FREQ_SUM that toggles for an interval in which all output signals of the N comparison circuits 21<0:2> have a preset logic level. The comparison and summation circuit 22 may include an XOR gate XOR for receiving N output signals that are output by the N comparison circuits 21<0:2>, respectively, and performing an XOR operation on the N output signals.

According to an embodiment, a preset logic level is a logic high level. In such a case, the comparison and summation circuit 22 may output the comparison summation signal FREQ_SUM having a logic high level when all three output signals that are output by the three comparison circuits 21<0:2>, respectively, have a logic high level or a logic low level.

The comparison and summation circuit 22 may output the comparison summation signal FREQ_SUM having a logic low level when one of the three output signals that are output by the three comparison circuits 21<0:2>, respectively, has a logic level that is different from logic levels of the remaining two signals.

The first delay circuit 25 may output the comparison summation signal FREQ_SUM by delaying the comparison summation signal FREQ_SUM by a set delay amount RC Delay.

The second delay circuit 24 may output a self-refresh delay signal SREF_DLY by delaying the self-refresh signal SREF having the activation state by the set delay amount RC Delay for the self-refresh section. In this case, as described with reference to FIG. 1, the set delay amount RC Delay may have a delay amount for sufficiently securing the activation state of the operation control signal PSRF, that is, for sufficiently securing the time taken to toggle the operation control signal PSRF.

Furthermore, the output of the operation control signal PSRF by the signal output circuit 23 in response to the self-refresh delay signal SREF_DLY may be for compensating for the delay of the comparison summation signal FREQ_SUM because the comparison summation signal FREQ_SUM is delayed by the set delay amount RC Delay and then transferred to the signal output circuit 23.

The signal output circuit 23 may output the comparison summation signal FREQ_SUM as the operation control signal PSRF in response to the self-refresh delay signal SREF_DLY. The signal output circuit 23 may include an AND gate AND for receiving the comparison summation signal FREQ_SUM and the self-refresh delay signal SREF_DLY and performing an AND operation on the received comparison summation signal FREQ_SUM and self-refresh delay signal SREF_DLY, and an inverter INV1 for outputting an output signal of the AND gate AND as the operation control signal PSRF by inverting the output signal.

Figure 3:
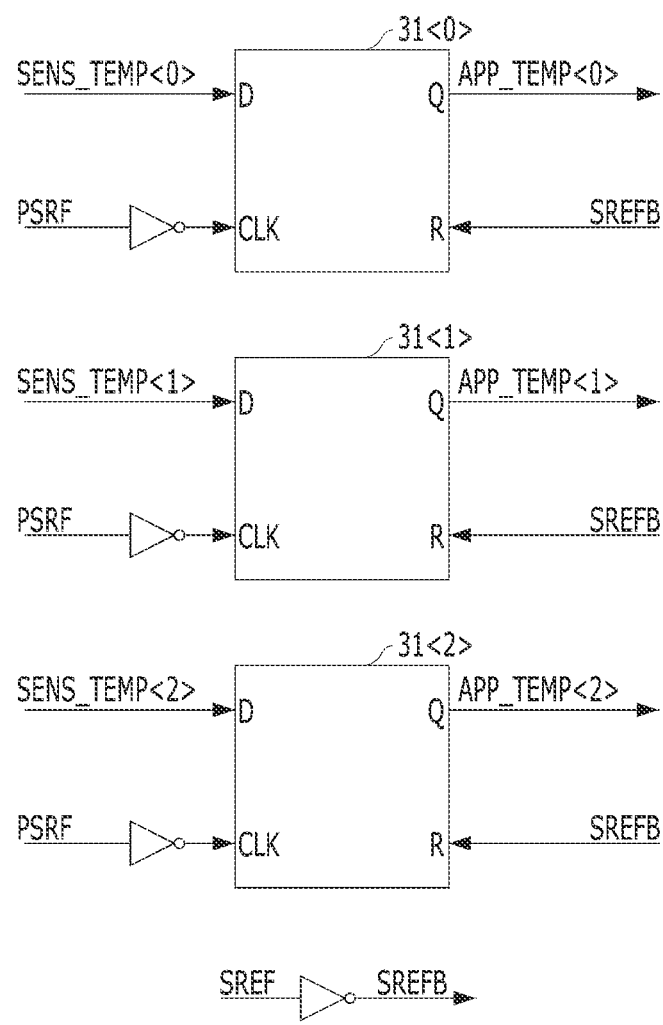
FIG. 3 is a diagram for describing a detailed construction of a temperature code output circuit among the components of the memory device disclosed in FIG. 1, according to an embodiment of the present disclosure.

FIG. 3 is a diagram for describing a detailed construction of the temperature code output circuit among the components of the memory device disclosed in FIG. 1, according to an embodiment of the present disclosure.

Referring to FIG. 3, the temperature code output circuit 13 may include N delay flip-flops 31<0:2>.

Each of the N delay flip-flops 31<0:2> may receive an inverted signal SREFB of the self-refresh signal SREF through a reset stage R of each of the N delay flip-flops, may receive an inverted operation control signal PSRFB of the operation control signal PSRF that is generated by the signal generation circuit 12 through a clock input stage CLK of each of the N delay flip-flops, and may receive each of the N bits that are included in the temperature detection codes SENS_TEMP<0:2> through an input stage D of each of the N delay flip-flops. Each of the N delay flip-flops 31<0:2> may transmit, to an output stage Q of each of the N delay flip-flops, each of the N bits that are included in the temperature application codes APP_TEMP<0:2>.

The self-refresh-inverted signal SREFB may be generated by inverting the phase of the self-refresh signal SREF through an inverter. Accordingly, in the self-refresh section in which the self-refresh signal SREF has been activated, the self-refresh-inverted signal SREFB that has been deactivated may be input to the reset stage R of each of the N delay flip-flops 31<0:2>. Accordingly, each of the N delay flip-flops 31<0:2> may output each of the temperature detection codes SENS_TEMP<0:2> as each of the temperature application codes APP_TEMP<0:2> in response to the operation control signal PSRF in the self-refresh section. In contrast, out of the self-refresh section in which the self-refresh signal SREF has been deactivated, the self-refresh-inverted signal SREFB that has been activated may be input to the reset stage R of each of the N delay flip-flops 31<0:2>. Accordingly, since the state of each of the N delay flip-flops 31<0:2> is a reset state out of the self-refresh section, values of the temperature application codes APP_TEMP<0:2> that have been initialized when exiting the self-refresh section may not be changed out of the self-refresh section.

The inverted operation control signal PSRFB may be generated by inverting the phase of the operation control signal PSRF through an inverter. Accordingly, each of the N delay flip-flops 31<0:2> may output each of the temperature detection codes SENS_TEMP<0:2> as each of the temperature application codes APP_TEMP<0:2>, at a timing at which the toggling of the inverted operation control signal PSRFB that is input to the clock input stage CLK is ended.

According to an embodiment, the first delay flip-flop 31<0> of the three delay flip-flops 31<0:2> may receive the inverted signal SREFB of the self-refresh signal SREF through the reset stage R of the first delay flip-flop 31<0>, may receive the inverted operation control signal PSRFB of the operation control signal PSRF through the clock input stage CLK of the first delay flip-flop 31<0>, may receive the first bit SENS_TEMP<0> of the temperature detection codes SENS_TEMP<0:2> through the input stage D of the first delay flip-flop 31<0>, and may transmit the first bit APP_TEMP<0> of the temperature application codes APP_TEMP<0:2> through the output stage Q of the first delay flip-flop 31<0>.

Likewise, the remaining delay flip-flops 31<1> and 31<2> may operate similarly to the first delay flip-flop 31<0>. For example, the second delay flip-flop 31<1> may transmit the second bit APP_TEMP<1> of the temperature application codes APP_TEMP<0:2> to the output stage Q of the second delay flip-flop 31<1>. The third delay flip-flop 31<2> may transmit the third bit APP_TEMP<2> of the temperature application codes APP_TEMP<0:2> to the output stage Q of the second delay flip-flop 31<1>.

Figure 4:
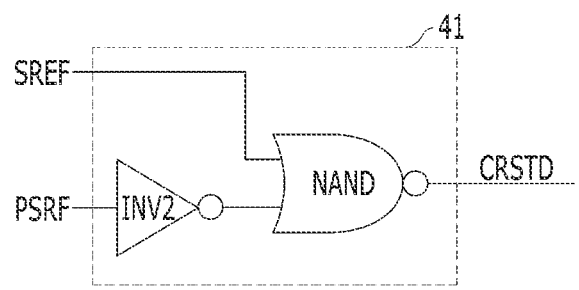
FIG. 4 is a diagram for describing a detailed construction of a reset signal output circuit among the components of the memory device disclosed in FIG. 1, according to an embodiment of the present disclosure.

FIG. 4 is a diagram for describing a detailed construction of the reset signal output circuit 16 among the components of the memory device disclosed in FIG. 1, according to an embodiment of the present disclosure.

Referring to FIG. 4, the reset signal output circuit 16 may include an inverter INV2 for inverting the operation control signal PSRF and a NAND gate NAND for receiving an output signal of the inverter INV2 and the self-refresh signal SREF, and outputting the output signal and the self-refresh signal SREF as the counting reset signal CRSTD by performing a NAND operation on the output signal and the self-refresh signal SREF. However, the components of the reset signal output circuit 16, which are illustrated in FIG. 4, may be merely an embodiment, and the present disclosure may not be limited to this embodiment. For example, the reset signal output circuit 16 may be implemented by using another circuit capable of toggling the counting reset signal CRSTD in response to the operation control signal PSRF toggling in the interval in which the self-refresh signal SREF is activated, which corresponds to the self-refresh section.

Figure 5:
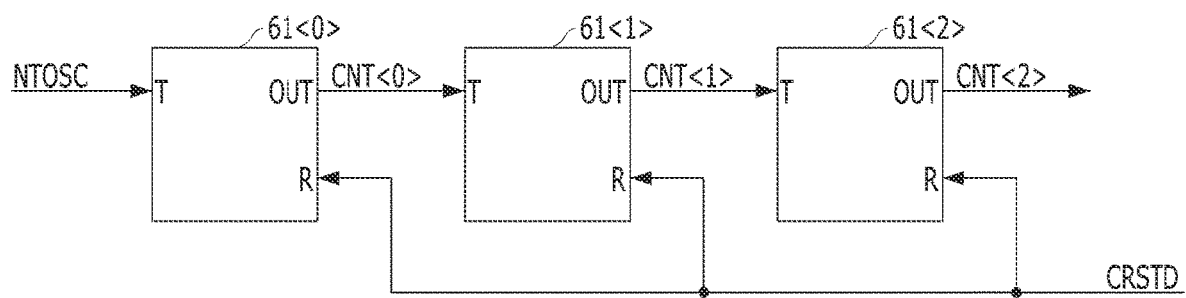
FIG. 5 is a diagram for describing a detailed construction of a counting circuit among the components of the memory device disclosed in FIG. 1, according to an embodiment of the present disclosure.

FIG. 5 is a diagram for describing a detailed construction of the counting circuit among the components of the memory device disclosed in FIG. 1, according to an embodiment of the present disclosure.

Referring to FIG. 5, the counting circuit 11 may include N toggle flip-flops 61<0:2> that are connected in a chain form.

Each of the N toggle flip-flops 61<0:2> may receive the counting reset signal CRSTD that is generated by the reset signal output circuit 16 through a reset stage R of each of the N toggle flip-flops, and may receive the reference cycle signal NTOSC that is generated by the oscillator 17 through an input stage (T of the toggle flip-flop 61<0>) of the first toggle flip-flop 61<0> of the N toggle flip-flops 61<0:2>. Each of the N toggle flip-flops 61<0:2> may output the counting codes CNT<0:2> having N bits through the output stage OUT of each of the N toggle flip-flops.

The N toggle flip-flops 61<0:2> may initialize the counting codes CNT<0:2> having the N bits, which are output through N output stages OUT of the N toggle flip-flops, respectively, in response to the counting reset signal CRSTD being activated, which is generated by the reset signal output circuit 16 and received through the reset stages R of the N toggle flip-flops. At this time, the reset signal output circuit 16 may toggle the counting reset signal CRSTD in response to the toggling of the operation control signal PSRF in the self-refresh section. Accordingly, the N toggle flip-flops 61<0:2> may initialize the counting codes CNT<0:2> having the N bits, which are output through the N output stages OUT, respectively, in response to the toggling of the operation control signal PSRF in the self-refresh section. Furthermore, the reset signal output circuit 16 may enable the counting reset signal CRSTD to have the deactivation state out of the self-refresh section. Accordingly, the N toggle flip-flops 61<0:2> may enable the counting codes CNT<0:2> having the N bits, which are output through the N output stages OUT, to have initialization states, respectively, out of the self-refresh section.

According to an embodiment, the first toggle flip-flop 61<0> of the three toggle flip-flops 61<0:2> may receive the counting reset signal CRSTD through the reset stage R of the first toggle flip-flop, may receive the reference cycle signal NTOSC through an input stage T of the first toggle flip-flop, and may transmit the first bit CNT<0> of the counting codes CNT<0:2> through the output stage OUT of the first toggle flip-flop.

The second toggle flip-flop 61<1> of the three toggle flip-flops 61<0:2> may receive the counting reset signal CRSTD through the reset stage R of the second toggle flip-flop 61<1>, may receive the first bit CNT<0> of the counting codes CNT<0:2> through an input stage T of the second toggle flip-flop 61<1>, and may transmit the second bit CNT<1> of the counting codes CNT<0:2> through the output stage OUT of the second toggle flip-flop 61<1>.

The third toggle flip-flop 61<2> of the three toggle flip-flops 61<0:2> may receive the counting reset signal CRSTD through the reset stage R of the third toggle flip-flop 61<2>, may receive the second bit CNT<1> of the counting codes CNT<0:2> through the input stage T of the third toggle flip-flop 61<2>, and may transmit the third bit CNT<2> of the counting codes CNT<0:2> through the output stage OUT of the third toggle flip-flop 61<2>.

FIGS. 6A to 6D are timing diagrams for describing an operation of the memory device disclosed in FIG. 1, according to an embodiment of the present disclosure.

Referring to FIGS. 6A to 6D, an operation of the memory device may be defined on the basis of the reference cycle signal NTOSC that toggles in a set frequency. In the memory device according to an embodiment of the present disclosure, each of the counting codes CNT<0:2>, the temperature detection codes SENS_TEMP<0:2>, and the temperature application codes APP_TEMP<0:2> may include three bits. However, this is merely an embodiment, and the present disclosure may not be limited to this embodiment. The number of bits of each of the counting codes CNT<0:2>, the temperature detection codes SENS_TEMP<0:2>, and the temperature application codes APP_TEMP<0:2> may be different.

Figure 6A:
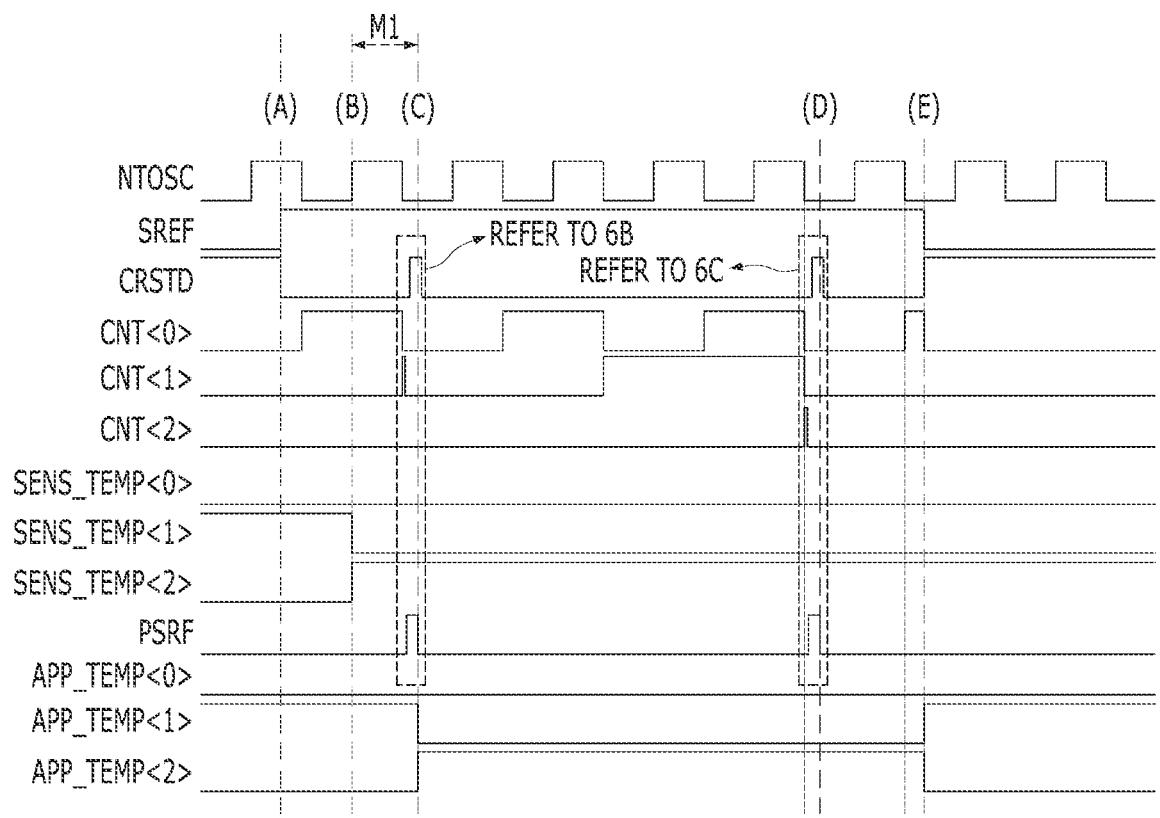
FIGS. 6A to 6D are timing diagrams for describing an operation of the memory device disclosed in FIG. 1, according to an embodiment of the present disclosure.

Referring to FIG. 6A, at timing (hereinafter referred to as "timing A") at which the logic level of the self-refresh signal SREF is activated to a logic high level, the self-refresh signal SREF may enter a self-refresh section. The "timing A" may be timing that is not related to an edge of the reference cycle signal NTOSC. That is, the entry timing of the self-refresh section may not be synchronized with an edge of the reference cycle signal NTOSC. However, this is merely an embodiment, and the present disclosure may not be limited to this embodiment. The entry timing of the self-refresh section may be synchronized with an edge of the reference cycle signal NTOSC. For example, FIG. 6A may be a timing diagram if the "timing A" at which the self-refresh signal SREF is activated is ahead of a falling edge of the reference cycle signal NTOSC.

At the "timing A", the logic level of the counting reset signal CRSTD may be deactivated to a logic low level in response to the logic level of the self-refresh signal SREF being activated to a logic high level. As the logic level of the counting reset signal CRSTD is deactivated to a logic low level, the counting codes CNT<0:2> may be increased at a falling edge of the reference cycle signal NTOSC. That is, at the "timing A", all three bit values of the counting codes CNT<0:2> may be in the state in which all three bit values have a logic low level. Thereafter, at the first falling edge of the reference cycle signal NTOSC, the logic level of the first bit CNT<0>, among the three bits that are included in the counting codes CNT<0:2>, may transition to a logic high level.

Thereafter, at the second falling edge of the reference cycle signal NTOSC, the logic level of the first bit CNT<0>, among the three bits that are included in the counting codes CNT<0:2>, may transition to a logic low level, the logic level of the second bit CNT<1>, among the three bits that are included in the counting codes CNT<0:2>, may transition to a logic high level, and the third bit CNT<2>, among the three bits that are included in the counting codes CNT<0:2>, may have a logic low level. In such a manner, the counting codes CNT<0:2> may be increased at a falling edge of the reference cycle signal NTOSC.

The state of the temperature application codes APP_TEMP<0:2> may be in an initialized state prior to the "timing A". That is, the state of initialized values of the temperature application codes APP_TEMP<0:2> may be the state in which the initialized values have not been changed out of the self-refresh section prior to the "timing A". According to an embodiment, the logic level of the first bit APP_TEMP<0>, among the three bits that are included in the temperature application codes APP_TEMP<0:2>, may be a logic low level, the logic level of the second bit APP_TEMP<1>, among the three bits that are included in the temperature application codes APP_TEMP<0:2>, may be a logic high level, and the logic level of the third bit APP_TEMP<2>, among the three bits that are included in the temperature application codes APP_TEMP<0:2>, may be a logic low level. For reference, the illustrated initialized values (i.e., the logic level of the first bit APP_TEMP<0> is a logic low level, the logic level of the second bit APP_TEMP<1> is a logic high level, and the logic level of the third bit APP_TEMP<2> is a logic low level) of the temperature application codes APP_TEMP<0:2> are merely an embodiment. The temperature application codes APP_TEMP<0:2> may be practically initialized to any values.

Values of the temperature detection codes SENS_TEMP<0:2> may be changed at a rising edge of the reference cycle signal NTOSC. Accordingly, at the first falling edge of the reference cycle signal NTOSC after the "timing A", values of the temperature detection codes SENS_TEMP<0:2> may not be changed in the same way prior to the "timing A". Furthermore, at a falling edge of the reference cycle signal NTOSC after the "timing A", the logic level of the first bit CNT<0>, among the three bits that are included in the counting codes CNT<0:2>, may transition to a logic high level, and the second bit CNT<1> and the third bit CNT<2>, among the three bits that are included in the counting codes CNT<0:2>, may have a logic low level. For reference, FIG. 6A illustrates that prior to the "timing A", values of the temperature detection codes SENS_TEMP<0:2> are identical with initialized values of the temperature application codes APP_TEMP<0:2>, but this is merely an embodiment. Practically, at a rising edge of the reference cycle signal NTOSC out of the self-refresh section prior to the "timing A", values of the temperature detection codes SENS_TEMP<0:2> may be changed to arbitrary values.

Next, values of the temperature detection codes SENS_TEMP<0:2> may be changed (hereinafter this timing is called "timing B") in synchronization with at a rising edge of the reference cycle signal NTOSC. At the "timing B", the first bit SENS_TEMP<0>, among the three bits that are included in the temperature detection codes SENS_TEMP<0:2>, may have a logic low level, the logic level of the second bit SENS_TEMP<1>, among the three bits that are included in the temperature detection codes SENS_TEMP<0:2>, may transition from a logic high level to a logic low level, and the logic level of the third bit SENS_TEMP<2>, among the three bits that are included in the temperature detection codes SENS_TEMP<0:2>, may transition from a logic low level to a logic high level.

Although values of the temperature detection codes SENS_TEMP<0:2> are changed at the "timing B", values of the temperature detection codes SENS_TEMP<0:2> may not be output as values of the temperature application codes APP_TEMP<0:2> because the operation control signal PSRF does not toggle.

After the "timing B", at a falling edge of the reference cycle signal NTOSC, the logic level of the first bit CNT<0>, among the three bits that are included in the counting codes CNT<0:2>, may transition to a logic low level, the logic level of the second bit CNT<1>, among the three bits that are included in the counting codes CNT<0:2>, may transition to a logic high level, and the third bit CNT<2>, among the three bits that are included in the counting codes CNT<0:2>, may have a logic low level. After the "timing B", at a falling edge of the reference cycle signal NTOSC, as values of the counting codes CNT<0:2> are changed, the state of values of the counting codes CNT<0:2> and the temperature application codes APP_TEMP<0:2> may become the state in which the values are identical with each other. That is, after the "timing B", at a falling edge of the reference cycle signal NTOSC, the logic level of each of the first bits APP_TEMP<0> and CNT<0>, among the three bits that are included in each of the temperature application codes APP_TEMP<0:2> and the counting codes CNT<0:2>, may be a logic low level, the logic level of each of the second bits APP_TEMP<1> and CNT<1>, among the three bits that are included in each of the temperature application codes APP_TEMP<0:2> and the counting codes CNT<0:2>, may be a logic high level, and the logic level of each of the third bits APP_TEMP<2> and CNT<2>, among the three bits that are included in each of the temperature application codes APP_TEMP<0:2> and the counting codes CNT<0:2>, may be a logic low level.

Figure 6B:
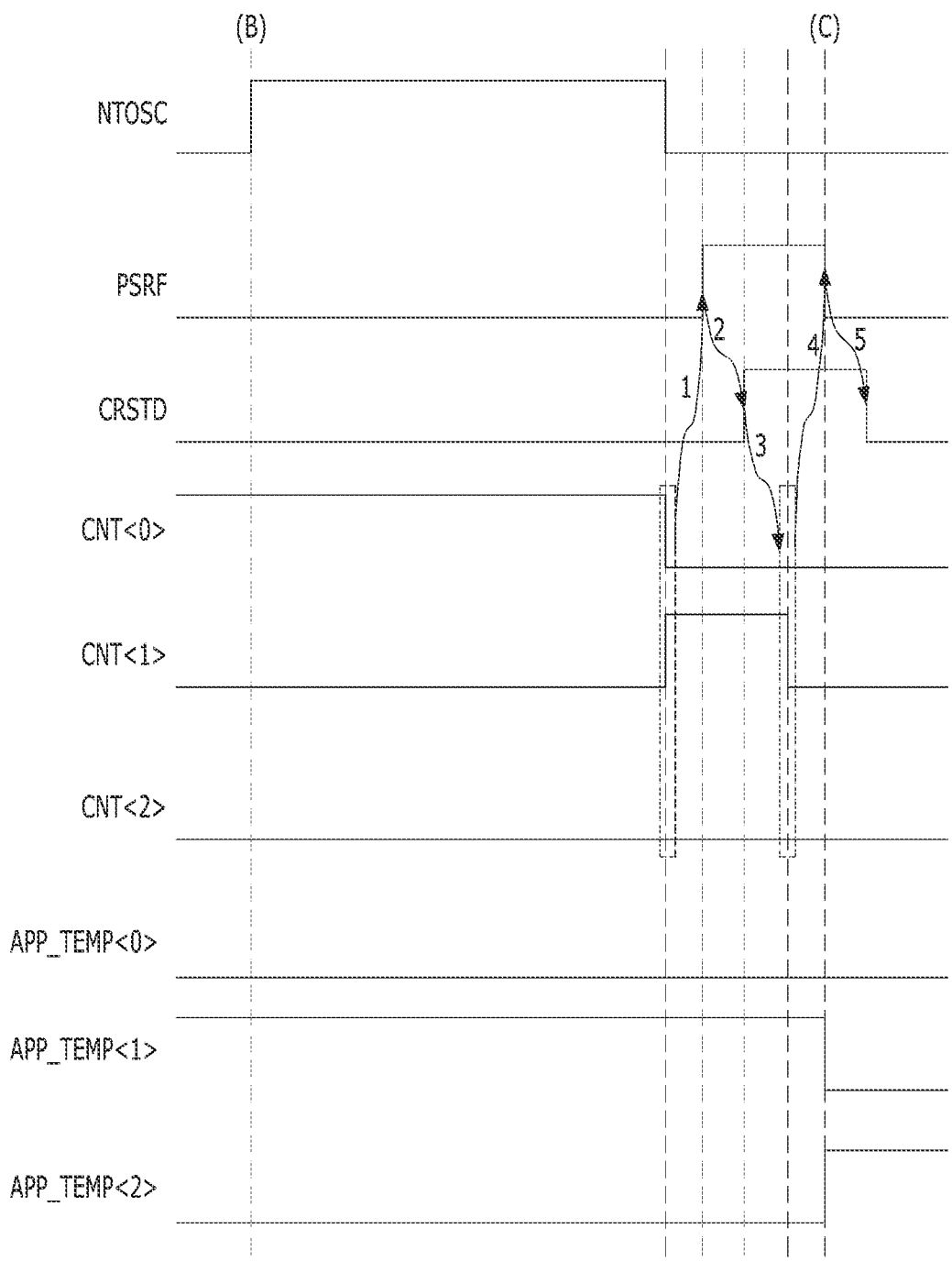

Referring to FIGS. 6A and 6B together, after the "timing B" corresponding to a falling edge of the reference cycle signal NTOSC, the logic level of the operation control signal PSRF may be activated to a logic high level (1) in response to the state of values of the counting codes CNT<0:2> and the temperature application codes APP_TEMP<0:2> being checked to be the state in which the values are identical with each other. The logic level of the counting reset signal CRSTD may be activated to a logic high level (2) in response to the logic level of the operation control signal PSRF being activated to a logic high level. Values of the counting codes CNT<0:2> may be initialized (3) in response to the logic level of the counting reset signal CRSTD being activated to a logic high level. The logic level of the operation control signal PSRF may be deactivated to a logic low level (4) (hereinafter "timing C") in response to values of the counting codes CNT<0:2> being initialized. The logic level of the counting reset signal CRSTD may be deactivated to a logic low level (5) in response to the operation control signal PSRF being deactivated to a logic low level. In this case, the length of the operation (1) to (4) corresponding to the activation interval of the operation control signal PSRF may be determined by a set delay amount. For example, the delay amount may be set by the RC delay, etc.

Referring back to FIG. 6A, at the "timing C" at which the logic level of the operation control signal PSRF is deactivated to a logic low level, values of the temperature detection codes SENS_TEMP<0:2> may be output as the temperature application codes APP_TEMP<0:2>. That is, at the "timing C", values of the temperature application codes APP_TEMP<0:2> may be updated. For example, at the "timing C" of the embodiment illustrated in FIG. 6A, the first bit APP_TEMP<0>, among the three bits that are included in the temperature application codes APP_TEMP<0:2>, may have a logic low level, the logic level of the second bit APP_TEMP<1>, among the three bits that are included in the temperature application codes APP_TEMP<0:2>, may transition from a logic high level to a logic low level, and the logic level of the third bit APP_TEMP<2>>, among the three bits that are included in the temperature application codes APP_TEMP<0:2>, may transition from a logic low level to a logic high level.

The "timing C" may be timing at which the toggling of the operation control signal PSRF that has been started in response to values of the counting codes CNT<0:2> being changed at a falling edge of the reference cycle signal NTOSC is completed. Since values of the temperature detection codes SENS_TEMP<0:2> are changed in synchronization with at a rising edge of the reference cycle signal NTOSC, at the "timing C", the values of the temperature detection codes SENS_TEMP<0:2> may be values that have been determined at the "timing B" at a rising edge of the reference cycle signal NTOSC prior to the "timing C". That is, after the self-refresh entry, the operation control signal PSRF may not start to toggle until values of the counting codes CNT<0:2> that are increased at a falling edge of the reference cycle signal NTOSC have the same state as initialized values of the temperature application codes APP_TEMP<0:2>.

In the embodiment illustrated in FIG. 6A, although self-refresh entry timing is ahead of a falling edge of the reference cycle signal NTOSC, the toggling of the operation control signal PSRF may be started in response to values of the counting codes CNT<0:2>, which are increased every falling edge of the reference cycle signal NTOSC, being identical with initialized values of the temperature application codes APP_TEMP<0:2> in the self-refresh section. Accordingly, the memory device according to an embodiment of the present disclosure can prevent the abnormal toggle of the operation control signal PSRF.

Furthermore, although values of the temperature detection codes SENS_TEMP<0:2> are changed at the "timing B", values of the temperature application codes APP_TEMP<0:2> can be prevented from being abnormally determined because a margin M1 between the "timing B" and the "timing C" at which the temperature application codes APP_TEMP<0:2> are changed can be secured. Accordingly, the memory device according to an embodiment of the present disclosure can prevent the signal generation circuit that toggles the operation control signal PSRF by receiving the temperature application codes APP_TEMP<0:2>, from malfunctioning.

After the "timing B", values of the counting codes CNT<0:2> may be initialized in response to the counting reset signal CRSTD toggling based on a falling edge of the reference cycle signal NTOSC. That is, after the "timing B", all three bits that are included in the counting codes CNT<0:2> may become the state in which all three bits have a logic low level based on a falling edge of the reference cycle signal NTOSC.

The initialized values of the counting codes CNT<0:2> may be increased again every falling edge of the reference cycle signal NTOSC. For example, at the first falling edge of the reference cycle signal NTOSC, the logic level of the first bit CNT<0>, among the three bits that are included in the counting codes CNT<0:2>, may transition to a logic high level. At the second falling edge of the reference cycle signal NTOSC, the logic level of the first bit CNT<0>, among the three bits that are included in the counting codes CNT<0:2>, may transition to a logic low level. The logic level of the second bit CNT<1>, among the three bits that are included in the counting codes CNT<0:2>, may transition to a logic high level. The third bit CNT<2>, among the three bits that are included in the counting codes CNT<0:2>, may have a logic low level. At the third falling edge of the reference cycle signal NTOSC, the logic level of the first bit CNT<0>, among the three bits that are included in the counting codes CNT<0:2>, may transition to a logic high level. The second bit CNT<1>, among the three bits that are included in the counting codes CNT<0:2>, may have a logic high level. The third bit CNT<2>, among the three bits that are included in the counting codes CNT<0:2>, may have a logic low level. At the fourth falling edge of the reference cycle signal NTOSC, the logic level of the first bit CNT<0>, among the three bits that are included in the counting codes CNT<0:2>, may transition to a logic low level. The logic level of the second bit CNT<1>, among the three bits that are included in the counting codes CNT<0:2>, may transition to a logic low level. The logic level of the third bit CNT<2>, among the three bits that are included in the counting codes CNT<0:2>, may transition to a logic high level. In such a manner, the counting codes CNT<0:2> may be increased at a falling edge of the reference cycle signal NTOSC.

After the "timing C", as values of the counting codes CNT<0:2> are changed at the fourth falling edge of the reference cycle signal NTOSC, the state of values of the counting codes CNT<0:2> and the temperature application codes APP_TEMP<0:2> may become the state in which the values are identical with each other. That is, after the "timing C", at the fourth falling edge of the reference cycle signal NTOSC, the logic level of each of the first bits APP_TEMP<0> and CNT<0>, among the three bits that are included in each of the temperature application codes APP_TEMP<0:2> and the counting codes CNT<0:2>, may be a logic low level. The logic level of each of the second bits APP_TEMP<1> and CNT<1>, among the three bits that are included in each of the temperature application codes APP_TEMP<0:2> and the counting codes CNT<0:2>, may be a logic low level. The logic level of each of the third bits APP_TEMP<2> and CNT<2>, among the three bits that are included in each of the temperature application codes APP_TEMP<0:2> and the counting codes CNT<0:2>, may be a logic high level.

Figure 6C:
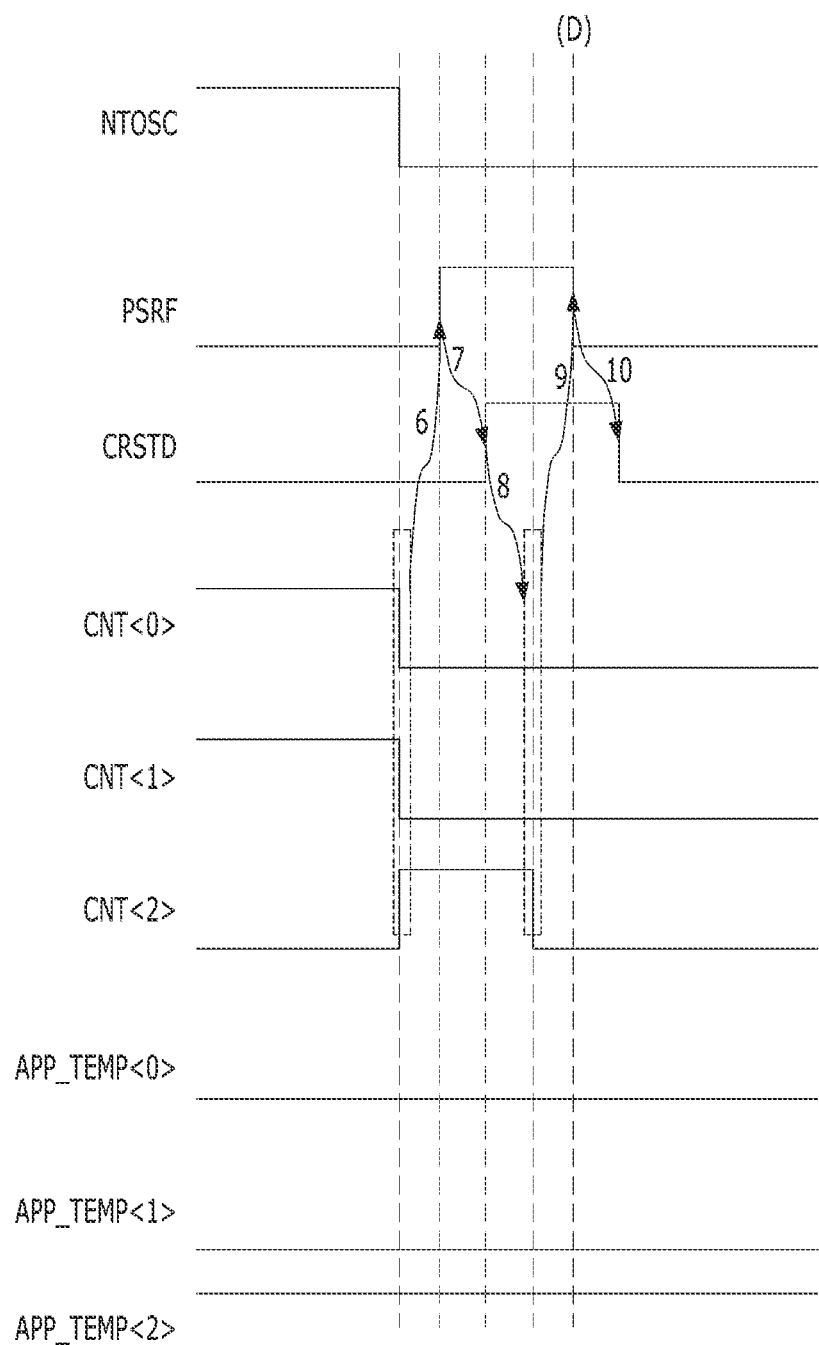

Referring to FIGS. 6A and 6C together, after the "timing C", at the fourth falling edge of the reference cycle signal NTOSC, the logic level of the operation control signal PSRF may be activated to a logic high level (6) in response to the state of values of the counting codes CNT<0:2> and the temperature application codes APP_TEMP<0:2> being checked to be the state in which the values are identical with each other. The logic level of the counting reset signal CRSTD may be activated to a logic high level (7) in response to the logic level of the operation control signal PSRF being activated to a logic high level. Values of the counting codes CNT<0:2> may be initialized (8) in response to the logic level of the counting reset signal CRSTD being activated to a logic high level. The logic level of the operation control signal PSRF may be deactivated to a logic low level (9) (hereinafter "timing D") in response to values of the counting codes CNT<0:2> being initialized. The logic level of the counting reset signal CRSTD may be deactivated to a logic low level (10) in response to the logic level of the operation control signal PSRF being deactivated to a logic low level. In this case, the length of the operation (6) to (9) corresponding to the activation interval of the operation control signal PSRF may be determined by a set delay amount. For example, the delay amount may be set by an RC delay, etc.

Referring back to FIG. 6A, after the "timing C", at the "timing D" at which the operation control signal PSRF toggles and the logic level of the operation control signal PSRF is deactivated to a logic low level, values of the temperature detection codes SENS_TEMP<0:2> may be output as the temperature application codes APP_TEMP<0:2>. That is, at the "timing D", values of the temperature application codes APP_TEMP<0:2> may be updated. At the "timing D", values of the temperature application codes APP_TEMP<0:2> may be changed in the same manner as values of the temperature detection codes SENS_TEMP<0:2>. Since values of the temperature detection codes SENS_TEMP<0:2> have never been changed between the "timing C" and the "timing D", the values of the temperature application codes APP_TEMP<0:2> may not be changed at the "timing D".

Thereafter, at "timing F" at which the logic level of the self-refresh signal SREF is deactivated to a logic low level, the memory device may exit from the self-refresh section. The "timing E" may be timing that is not related to an edge of the reference cycle signal NTOSC. That is, the exit timing of the self-refresh section may not be synchronized with an edge of the reference cycle signal NTOSC. However, this is merely an embodiment, and the present disclosure may not be limited to this embodiment. The exit timing of the self-refresh section may be synchronized with an edge of the reference cycle signal NTOSC.

The logic level of the counting reset signal CRSTD may be activated to a logic high level in response to the logic level of the self-refresh signal SREF being deactivated to a logic low level at the "timing E". As the logic level of the counting reset signal CRSTD is activated to a logic high level, values of the counting codes CNT<0:2> and values of the temperature application codes APP_TEMP<0:2> may be initialized. That is, after the "timing E", all three bits that are included in the counting codes CNT<0:2> may have a logic low level. Furthermore, after the "timing E", the logic level of the first bit APP_TEMP<0>, among the three bits that are included in the temperature application codes APP_TEMP<0:2>, may be a logic low level. The logic level of the second bit APP_TEMP<1>, among the three bits that are included in the temperature application codes APP_TEMP<0:2>, may be a logic high level. The logic level of the third bit APP_TEMP<2>, among the three bits that are included in the temperature application codes APP_TEMP<0:2>, may be a logic low level. After the "timing E", the temperature detection codes SENS_TEMP<0:2> may have values that have been determined prior to the "timing E". That is, after the "timing E", the logic level of the first bit SENS_TEMP<0>, among the three bits that are included in the temperature detection codes SENS_TEMP<0:2>, may be a logic low level. The logic level of the second bit SENS_TEMP<1>, among the three bits that are included in the temperature detection codes SENS_TEMP<0:2>, may be a logic low level. The logic level of the third bit SENS_TEMP<2>, among the three bits that are included in the temperature detection codes SENS_TEMP<0:2>, may be a logic high level.

Figure 6D:
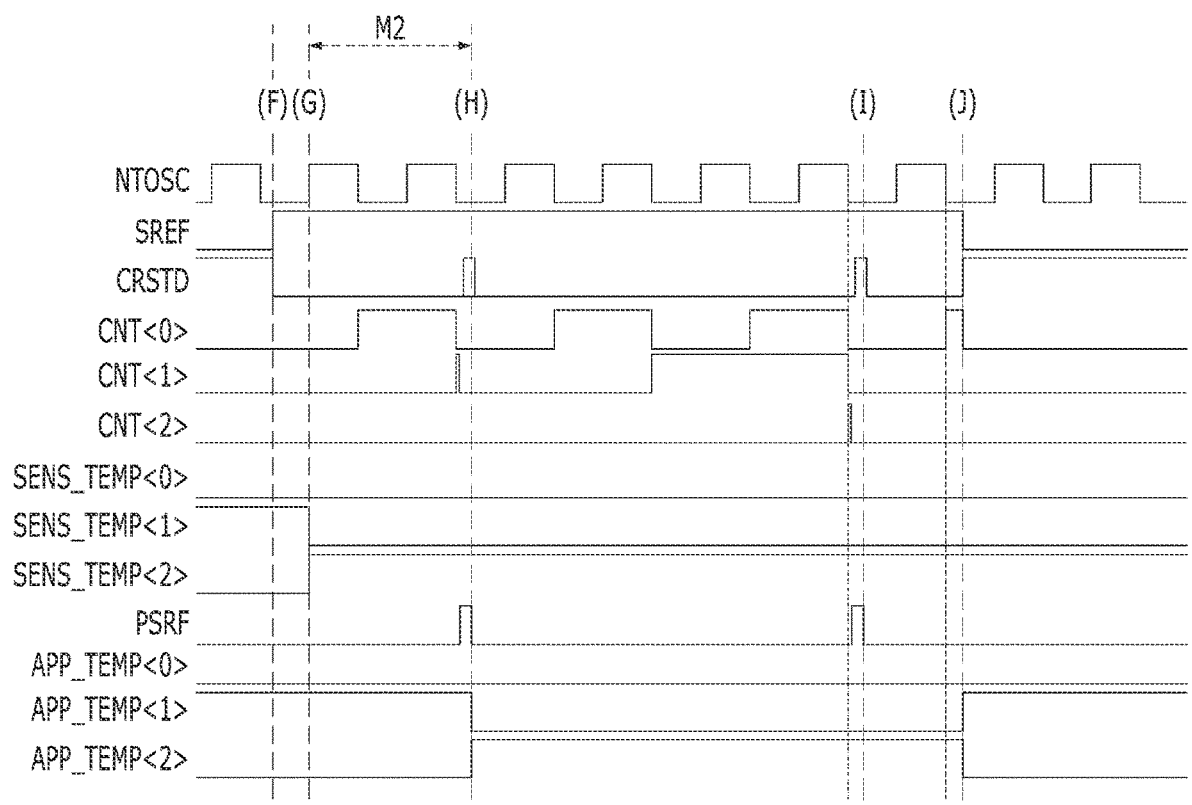

Referring to FIG. 6D, at timing (hereinafter referred to as "timing F") at which the logic level of the self-refresh signal SREF is activated to a logic high level and the self-refresh signal SREF enters a self-refresh section. The "timing F" may correspond to the "timing A" illustrated in FIG. 6A. However, unlike FIG. 6A, FIG. 6D may be a timing diagram in which the "timing F" at which the self-refresh signal SREF is activated is ahead of a rising edge of the reference cycle signal NTOSC.

At the "timing F", the logic level of the counting reset signal CRSTD may be deactivated to a logic low level in response to the logic level of the self-refresh signal SREF being activated to a logic high level. After the logic level of the counting reset signal CRSTD is deactivated to a logic low level, the counting codes CNT<0:2> may be increased at a falling edge of the reference cycle signal NTOSC. That is, at the "timing F", the state of all three bit values of the counting codes CNT<0:2> may be the state in which all three bit values have a logic low level.

Values of the temperature detection codes SENS_TEMP<0:2> may be changed (hereinafter this timing is called "timing G") in synchronization with the first rising edge of the reference cycle signal NTOSC after the "timing F". For example, the "timing G" illustrated in FIG. 6D may correspond to the "timing B" illustrated in FIGS. 6A and 6B. Although values of the temperature detection codes SENS_TEMP<0:2> are changed at the "timing G", the operation control signal PSRF does not toggle. Accordingly, the values of the temperature detection codes SENS_TEMP<0:2> may not be applied as the values of the temperature application codes APP_TEMP<0:2>. That is, the values of the temperature application codes APP_TEMP<0:2> may maintain an initialized state prior to the "timing F".

After the "timing G", at the first falling edge of the reference cycle signal NTOSC, the logic level of the first bit CNT<0>, among the three bits that are included in the counting codes CNT<0:2>, may transition to a logic high level, and the second bit CNT<1> and the third bit CNT<2>, among the three bits that are included in the counting codes CNT<0:2>, may have a logic low level. After the "timing G", at the second falling edge of the reference cycle signal NTOSC, the logic level of the first bit CNT<0>, among the three bits that are included in the counting codes CNT<0:2>, may transition to a logic low level. The logic level of the second bit CNT<1>, among the three bits that are included in the counting codes CNT<0:2>, may transition to a logic high level. The third bit CNT<2>, among the three bits that are included in the counting codes CNT<0:2>, may have a logic low level.

After the "timing G", at the second falling edge of the reference cycle signal NTOSC, as values of the counting codes CNT<0:2> are changed, the state of values of the counting codes CNT<0:2> and the temperature application codes APP_TEMP<0:2> may become the state in which the values are identical with each other. That is, after the "timing G", at the second falling edge of the reference cycle signal NTOSC, the logic level of each of the first bits APP_TEMP<0> and CNT<0>, among the three bits that are included in each of the temperature application codes APP_TEMP<0:2> and the counting codes CNT<0:2>, may be a logic low level. The logic level of each of the second bits APP_TEMP<1> and CNT<1>, among the three bits that are included in each of the temperature application codes APP_TEMP<0:2> and the counting codes CNT<0:2>, may be a logic high level. The logic level of each of the third bits APP_TEMP<2> and CNT<2>, among the three bits that are included in each of the temperature application codes APP_TEMP<0:2> and the counting codes CNT<0:2>, may be a logic low level.

In the operation of the memory device illustrated in FIG. 6D, the operation of toggling the operation control signal PSRF and the counting reset signal CRSTD and the operation of initializing the counting codes CNT<0:2> may correspond to the operations of the memory device illustrated in FIGS. 6A to 6C. For example, "timing H" at which the logic level of the operation control signal PSRF is deactivated to a logic low level may correspond to the "timing C". "Timing I" at which the logic level of the operation control signal PSRF is deactivated to a logic low level may correspond to the "timing D". "Timing J" at which the self-refresh signal SREF is deactivated to a logic low level may correspond to the "timing E".

At the "timing H", values of the temperature detection codes SENS_TEMP<0:2> may be output as the temperature application codes APP_TEMP<0:2>. Since the values of the temperature detection codes SENS_TEMP<0:2> are changed in synchronization with a rising edge of the reference cycle signal NTOSC, values of the temperature detection codes SENS_TEMP<0:2> at the "timing H" may be values that have been determined at the "timing G", that is, a rising edge of the reference cycle signal NTOSC prior to the "timing H". That is, after the self-refresh entry, the operation control signal PSRF may not start to toggle until values of the counting codes CNT<0:2> that are increased at a falling edge of the reference cycle signal NTOSC become the same state as initialized values of the temperature application codes APP_TEMP<0:2>.

In the embodiment illustrated in FIG. 6D, although the self-refresh entry timing is ahead of the rising edge of the reference cycle signal NTOSC, the toggling of the operation control signal PSRF may be started in response to values of the counting codes CNT<0:2>, which are increased every falling edge of the reference cycle signal NTOSC, being identical with initialized values of the temperature application codes APP_TEMP<0:2> in the self-refresh section. Accordingly, the memory device according to an embodiment of the present disclosure can prevent the abnormal toggle of the operation control signal PSRF.

Furthermore, although values of the temperature detection codes SENS_TEMP<0:2> are changed at the "timing G", values of the temperature application codes APP_TEMP<0:2> can be prevented from being abnormally determined because a margin M2 between the "timing G" and the "timing H" at which the temperature application codes APP_TEMP<0:2> are changed can be secured. Accordingly, the memory device according to an embodiment of the present disclosure can prevent the signal generation circuit that toggles the operation control signal PSRF by receiving the temperature application codes APP_TEMP<0:2>, from malfunctioning.

In the aforementioned description, the expression of the falling edge and rising edge of a specific signal is merely an embodiment in which the falling edge and the rising edge indicate opposite edges of the specific signal, and the present disclosure may not be limited to the expression. For example, if a first edge of a specific signal is set as a falling edge, a second edge of the specific signal may be set as a rising edge. In contrast, if a first edge of a specific signal is set as a rising edge, a second edge of the specific signal may be set as a falling edge.

Figure 7:
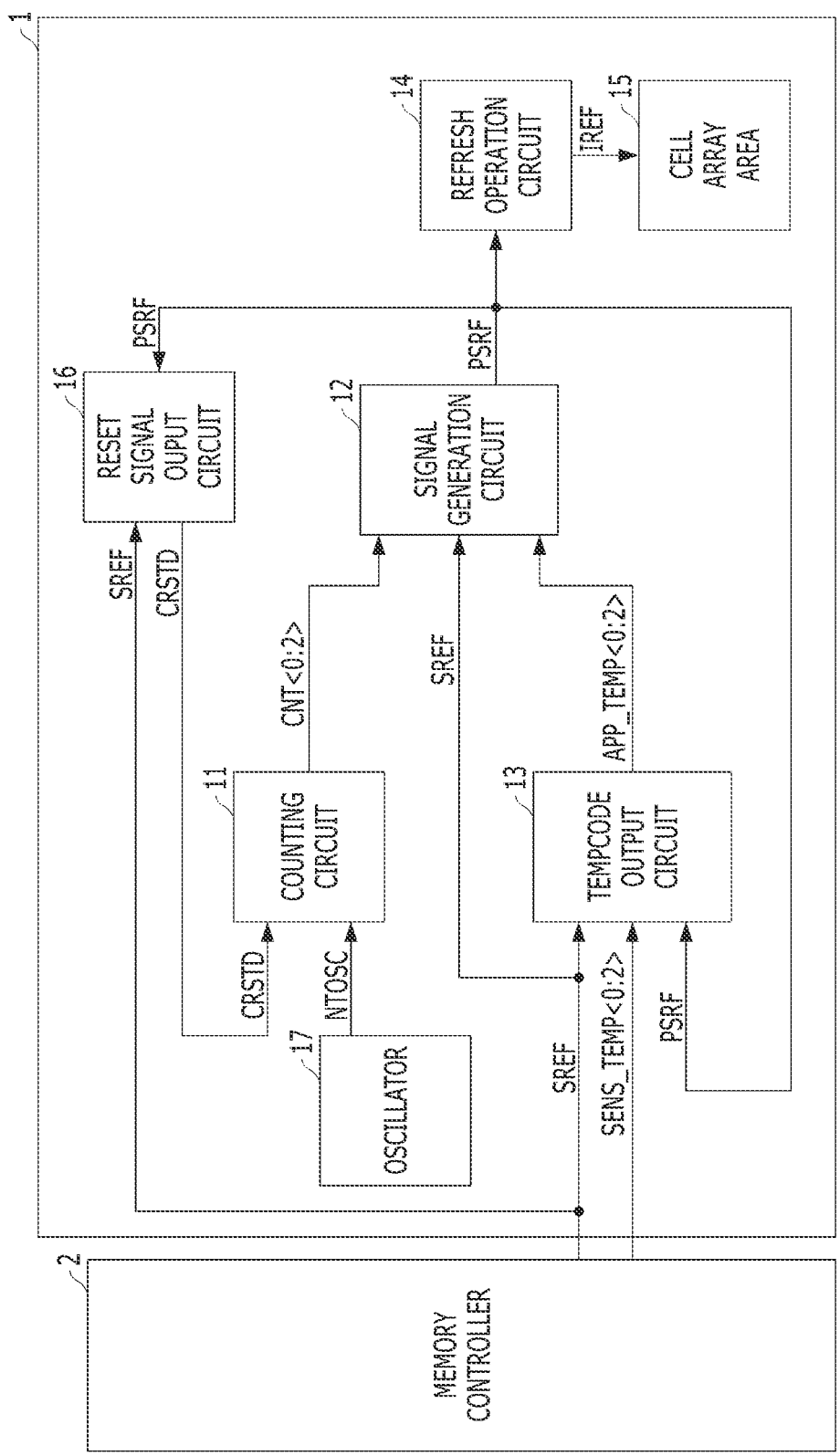
FIG. 7 is a diagram for describing a memory system which includes the memory device disclosed in FIG. 1, according to an embodiment of the present disclosure.

FIG. 7 is a diagram for describing a memory system which includes the memory device disclosed in FIG. 1, according to an embodiment of the present disclosure.

Referring to FIG. 7, the memory system according to an embodiment of the present disclosure may include the memory device 1, and a memory controller 2. In this case, the memory device 1 may include the counting circuit 11, the signal generation circuit 12, the temperature code output circuit 13, the refresh operation circuit 14, the cell array area 15, the reset signal output circuit 16, and the oscillator 17.

That is, the memory device 1 disclosed in FIG. 7 may have the same construction and operation that have been described with reference to FIGS. 1 to 6D. That is, the memory device 1 disclosed in FIG. 7 may change the cycle in which a refresh operation is performed on the cell array area 15 in response to values of the temperature detection codes SENS_TEMP<0:2> in a self-refresh section. In particular, the memory device 1 may control timing of an operation of applying the temperature codes to a refresh cycle change and timing of the self-refresh entry operation to have a predetermined margin. Accordingly, the memory device 1 can control so that the self-refresh entry operation and the operation of applying the temperature codes to the refresh cycle change do not influence each other.

The memory controller 2 may output the self-refresh signal SREF and the temperature detection codes SENS_TEMP<0:2> to the memory device 1. The memory controller 2 may control the memory device 1 to enter a self-refresh section by activating the self-refresh signal SREF. The memory controller 2 may control the memory device 1 to exit from a self-refresh section by deactivating the self-refresh signal SREF. According to an embodiment, although not illustrated, the memory controller 2 may include a temperature detection circuit for measuring an operating temperature of the memory device 1 or the memory system, and generate the temperature detection codes SENS_TEMP<0:2> in accordance with the results of the measurement.

According to an embodiment, although not illustrated, the memory controller 2 may include a temperature detection circuit for generating the temperature detection codes SENS_TEMP<0:2> values which are changed based on a potential level of a temperature detection signal that is applied from the outside (e.g., a host).

Since the operating temperature of the memory device 1 or the memory system may be irregularly changed, timing at which values of the temperature detection codes SENS_TEMP<0:2> that are generated by the temperature detection circuit of the memory controller 2 may be irregular. Accordingly, although not illustrated, the memory device 1 may further include a temperature reception circuit for receiving the temperature detection codes SENS_TEMP<0:2> that are transmitted by the memory controller 2 at a rising edge of the reference cycle signal NTOSC. Accordingly, values of the temperature detection codes SENS_TEMP<0:2> that are received by the memory device 1 may be changed at the rising edge of the reference cycle signal NTOSC.

The present disclosure described above is not limited to the aforementioned embodiments and accompanying drawings. It is evident to a person having ordinary knowledge in the art to which the present disclosure pertains that the present disclosure may be substituted, modified, and changed in various ways without departing from the technical spirit of the present disclosure and the following claims. For example, the location and type of logic gate illustrated in the aforementioned embodiment should be differently implemented depending on the polarity of an input signal. Furthermore, the embodiments may be combined to form additional embodiments.

What is claimed is:
1. A memory device comprising:
a counting circuit configured to generate a counting code by counting a first edge of a reference cycle signal having a given frequency in a self-refresh section;

a temperature code output circuit configured to:
receive a temperature detection code that is synchronized with a second edge of the reference cycle signal,
output the temperature detection code as a temperature application code in response to a toggling of the operation control signal in the self-refresh section, and
output the temperature application code that is initialized out of the self-refresh section;
a signal generation circuit configured to:
compare the counting code and the temperature application code in the self-refresh section, and
generate the operation control signal the toggling of which is controlled based on a result of the comparison; and
a refresh operation circuit configured to perform a refresh operation on a cell array area in response to the toggling of the operation control signal in the self-refresh section.

2. The memory device of claim 1, wherein the signal generation circuit comprises:
N comparison circuits configured to compare N bits that are included in the counting code and N bits that are included in the temperature application code, respectively;
a comparison and summation circuit configured to generate a comparison summation signal that toggles for an interval in which all output signals of N comparison circuits have a preset logic level;
a first delay circuit configured to output the comparison summation signal by delaying the comparison summation signal by a set delay amount;
a second delay circuit configured to output a self-refresh delay signal by delaying, by the set delay amount, a self-refresh signal having an activation state for the self-refresh section; and
a signal output circuit configured to output the comparison summation signal as the operation control signal in response to the self-refresh delay signal,
wherein the N is a natural number that is equal to or greater than 2.

3. The memory device of claim 2, wherein the temperature code output circuit comprises N delay flip-flops each configured to:
receive an inverted signal of the self-refresh signal through a reset stage of the N delay flip-flop,
receive an inverted signal of the operation control signal through a clock input stage of the N delay flip-flop,
receive each of the N bits that are included in the temperature detection code through an input stage of the N delay flip-flop, and
output each of the N bits that are included in the temperature application code to an output stage of the N delay flip-flop.

4. The memory device of claim 1, wherein:
the counting circuit is further configured to initialize a value of the counting code in response to a counting reset signal, and
the memory device further comprises a reset signal output circuit configured to:
output the counting reset signal in response to the operation control signal in the self-refresh section, and
activate the counting reset signal out of the self-refresh section.

5. The memory device of claim 4, wherein the counting circuit is configured to generate the counting code by increasing the value of the counting code in response to a first edge of the reference cycle signal in a deactivation interval of the counting reset signal.

6. The memory device of claim 4, wherein the counting circuit comprises N toggle flip-flops connected in a chain form and configured to:
receive the counting reset signal through reset stages of the N toggle flip-flops, and
output the counting code having N bits through N output stages of the N toggle flip-flops in response to the reference cycle signal that is received through a first input stage among N input stages of the N toggle flip-flops.

7. The memory device of claim 1, further comprising a temperature detection circuit configured to:
measure an operating temperature of the memory device, and
output the temperature detection code that is generated based on a result of the measurement at a second edge of the reference cycle signal.

8. The memory device of claim 1, further comprising a temperature reception circuit configured to receive the temperature detection code that is received from an outside at a second edge of the reference cycle signal.

9. An operating method of a memory device, comprising:
entering self-refresh section;
updating a counting code by counting an edge of a reference cycle signal;
first activating an operation control signal for the self-refresh section when a temperature application code has an initialized value in response to the counting code;
updating the temperature application code after the operation control signal is first activated;
second activating the operation control signal in response to the counting code based on the updated temperature application code;
exiting from the self-refresh section; and
initializing the counting code and the temperature application code.

10. The operating method of claim 9, wherein the operation control signal is first or second activated when the counting code and the temperature application code have an identical value.

11. A memory device comprising:
a counting circuit configured to increase a value of a counting code in response to a first edge of a reference cycle signal having a given frequency in an activation interval of a self-refresh signal;
a temperature code output circuit configured to:
receive a temperature detection code that is synchronized with a second edge of the reference cycle signal after the self-refresh signal is activated, and
output the temperature detection code as a temperature application code in response to an operation control signal being toggled after the self-refresh signal is activated;
a signal generation circuit configured to toggle the operation control signal in response to the counting code in the activation interval of the self-refresh signal after the first edge of at least one reference cycle signal elapses after the self-refresh signal is activated; and
a refresh operation circuit configured to perform a refresh operation on a cell array area in response to the toggling of the operation control signal in the activation interval of the self-refresh signal.

12. The memory device of claim 11, wherein the signal generation circuit is configured to toggle the operation control signal in response to both the counting code and the temperature application code having an identical value after the self-refresh signal is activated.

13. The memory device of claim 12, wherein the temperature code output circuit is configured to output the temperature application code that is initialized in a deactivation interval of the self-refresh signal.

14. The memory device of claim 13, wherein:
the counting circuit is further configured to initialize the value of the counting code when a state of the counting reset signal is an activation state, and
the memory device further comprises a reset signal output circuit configured to:
toggle the counting reset signal to an activation state in response to the toggling of the operation control signal in the activation interval of the self-refresh signal, and
output the counting reset signal having the activation state for a deactivation interval of the self-refresh signal.

15. The memory device of claim 11, further comprising a temperature detection circuit configured to:
measure an operating temperature of the memory device, and
output the temperature detection code that is generated based on a result of the measurement at a second edge of the reference cycle signal.

16. The memory device of claim 11, further comprising a temperature reception circuit configured to receive the temperature detection code that is received from an outside at a second edge of the reference cycle signal.

17. A memory device comprising:
an operation circuit configured to perform a refresh operation on a memory cell array whenever a first signal toggles;
a reset control circuit configured to generate a second signal, which is enabled and disabled respectively when the first signal is enabled and disabled;
a counting circuit configured to count a clock to generate a count code while the second signal is disabled and configured to keep the count code initialized while the second signal is enabled;
a temperature circuit configured to generate a temperature code whenever the first signal becomes disabled; and
a control circuit configured to enable the first signal when the count code is identical to the temperature code and configured to disable the first signal otherwise.

18. A memory device comprising:
an operation circuit configured to perform a refresh operation on a memory cell array whenever a control signal toggles;
a counting circuit configured to count a clock to generate a count code while the control signal is disabled and configured to keep the count code initialized while the control signal is enabled;
a temperature circuit configured to generate a temperature code whenever the control signal becomes disabled; and
a control circuit configured to enable the control signal when the count code is equal to the temperature code and configured to disable the control signal otherwise.

* * * * *